United States Patent [19]

Telser et al.

[11] Patent Number: 5,262,486
[45] Date of Patent: Nov. 16, 1993

[54] MODIFIED EMULSION POLYMERS, IN PARTICULAR FOR PHOTOPOLYMERIZABLE RECORDING MATERIALS WHICH CAN BE DEVELOPED IN WATER AND AQUEOUS SOLVENTS

[75] Inventors: Thomas Telser, Weinheim; Martin Meister, Neustadt; Horst Koch, Gruenstadt, all of Fed. Rep. of Germany

[73] Assignee: BASF Aktiengesellschaft, Ludwigshafen, Fed. Rep. of Germany

[21] Appl. No.: 730,766

[22] Filed: Jul. 16, 1991

[30] Foreign Application Priority Data

Jul. 21, 1990 [DE]  Fed. Rep. of Germany ....... 4023240

[51] Int. Cl.$^5$ .............................................. C08F 4/00
[52] U.S. Cl. ................... 525/243; 525/279; 525/286; 525/902; 525/919
[58] Field of Search ............... 525/286, 919, 279, 243, 525/902

[56] References Cited

U.S. PATENT DOCUMENTS

| 3,895,082 | 7/1975 | Hochberg | 260/885 |
| 4,275,142 | 6/1981 | Hosaka et al. | 430/271 |

FOREIGN PATENT DOCUMENTS

| 164270 | 12/1985 | European Pat. Off. |  |
| 261910 | 3/1988 | European Pat. Off. |  |
| 356954 | 3/1990 | European Pat. Off. |  |
| 3837324 | 5/1990 | Fed. Rep. of Germany |  |
| 62-100501 | 5/1987 | Japan | 525/286 |
| 62-262855 | 11/1987 | Japan | 525/286 |
| 63-122704 | 5/1988 | Japan | 525/286 |
| 2151636 | 7/1985 | United Kingdom | 525/279 |

*Primary Examiner*—Marion E. McCamish
*Assistant Examiner*—Mark A. Chapman
*Attorney, Agent, or Firm*—Keil & Weinkauf

[57] ABSTRACT

Modified polymers in acid form or in the form of their salts consist of

A) a carboxyl-containing copolymer prepared by emulsion polymerization and
B) side radicals introduced therein by partial grafting onto the carboxyl groups and of the general formula I

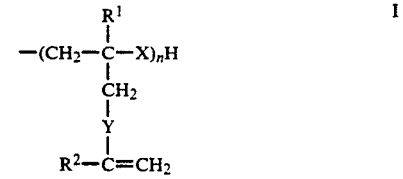

where $R^1$ and $R^2$ are each hydrogen or $C_1$-$C_5$-alkyl, X is oxygen, sulfur or imino, Y is an ester, amide, ether or $C_1$-$C_{10}$-alkylene group and $1 < n \leq 100$ for the average number n of the monomer units undergoing addition per reacted acid function.

2 Claims, No Drawings

MODIFIED EMULSION POLYMERS, IN PARTICULAR FOR PHOTOPOLYMERIZABLE RECORDING MATERIALS WHICH CAN BE DEVELOPED IN WATER AND AQUEOUS SOLVENTS

The present invention relates to modified polymers in acid form or in the form of their salts, consisting of
A) a carboxyl-containing copolymer prepared by emulsion polymerization and
B) side radicals which have been introduced therein by partial grafting onto the carboxyl groups and of the general formula I

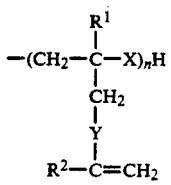

where $R^1$ and $R^2$ are each hydrogen or $C_1$-$C_5$-alkyl, X is oxygen, sulfur or imino, Y is an ester, amide, ether or $C_1$-$C_{10}$-alkylene group and $1 < n \leq 100$ for the average number n of the monomer units undergoing addition per reacted acid function.

The present invention furthermore relates to photopolymerizable recording materials which can be developed in water and aqueous solvents and which contain these modified emulsion polymers, and to the relief-forming printing plates produced using these recording materials.

Printing plates which have good resistance to water, ethanol and ethanol/ethyl acetate mixtures are known. However, these printing plates have decisive disadvantages, for example the necessity of highly toxic washout media (tetrachloroethylene, U.S. Pat. No. 4,423,135) or flammable washout media (ethanol/water mixtures, DE-A 27 22 421) or strongly alkaline developers (EP-A 162 570) or dependence on the use of liquid resins (DE-A 33 19 676).

Photosensitive compositions (formulations) for plates which can be developed in pure water to give the printing plate are likewise known. The developability in water, i.e. the water solubility of the unexposed parts, is achieved in every case by virtue of the f act that some or all of the acidic or basic groups in the polymeric binder are neutralized by low molecular weight basic or acidic components of the formulation.

Layers in which the neutralization of acidic groups in the polymer is achieved by added amines or amine-containing monomers or special amino alcohols are described, for example, in EP-A 261 910, EP-A 164 270 or DE-A 38 37 324. Neutralization with alkali metal hydroxides and/or amines has also been previously described (U.S. Pat. No 4,275,142).

None of these layers meet the broad requirements for a printing plate for flexographic printing inks, including resistance to the abovementioned ink solvents. They are possibly of interest for the flexographic printing of newspapers, where strength is required only for a limited print run and water-based inks are mainly used.

It is an object of the present invention to provide polymers for photosensitive layers whose unexposed parts can be developed in pure water to give the printing plates and whose exposed parts exhibit good flexible and resilient properties. Printing plates produced therefrom should be capable of being printed using flexographic printing inks based on ethanol, water or ethanol/ethyl acetate and should be suitable for long print runs.

We have found, surprisingly, that this object is achieved by the modified emulsion polymers defined at the outset.

The novel polymers preferably contain from 40 to 80% by weight of one or more conjugated dienes $a_1$), from 10 to 50% by weight of one or more ethylenically $\alpha,\beta$-unsaturated acids $a_2$) and not more than 50% by weight of one or more ethylenically unsaturated monomers $a_3$).

The conjugated dienes $a_1$) used may be, for example, butadiene, isoprene or chloroprene. Butadiene is preferably used. The ethylenically $\alpha,\beta$-unsaturated acids $a_2$) used may be, for example, acrylic acid, methacrylic acid or itaconic acid. Methacrylic acid is preferred. If necessary, the acids $a_2$) may also contain more than one carboxyl group.

Examples of possible further ethylenically unsaturated monomers $a_3$) are (meth)acrylates, (meth)acrylamides, (meth)acrylonitrile and/or vinylaromatics.

(Meth)acrylates and (meth)acrylamides which are particularly suitable comonomers $a_3$) are those of the general formula III

where $R^3$ hydrogen or methyl, $R^4$ is an alkyl or cycloalkyl radical of 1 to 15 carbon atoms or $\omega$-methyl-poly(alkylene oxide)-$\alpha$-oxyl and Z is oxygen or $NR^5$ in which $R^5$ is H or $C_1$-$C_4$-alkyl. Examples of suitable (meth)acrylates and/or (meth)acrylamides are methyl acrylate, methyl methacrylate, ethyl acrylate, ethyl methacrylate, propyl acrylate, propyl methacrylate, n-butyl acrylate, n-butyl methacrylate, n-pentyl acrylate, n-pentyl methacrylate, n-hexyl acrylate, n-hexyl methacrylate, tert-butyl acrylate, cyclohexyl acrylate, cyclohexyl methacrylate, 2-ethylhexyl acrylate, 2-ethylhexyl methacrylate, dicyclopentadienyl acrylate, lauryl acrylate, lauryl methacrylate, $\omega$-methyl-poly(ethylene oxide)-$\alpha$-yl (meth)acrylate, $\omega$-methyl-poly(propylene 1,2-oxide)-$\alpha$-yl (meth)acrylate, $\omega$-methylpoly(propylene 1,3-oxide)-$\alpha$-yl (meth)acrylate, etc., N-ethylacrylamide, N-methyl-N-butylmethacrylamide, N-ethyl-N-(2-ethylhexyl)-acrylamide, etc. n-Butyl acrylate, 2-ethylhexyl acrylate, $\omega$-methyl-poly(ethylene oxide)-$\alpha$-yl acrylate and dicyclopentadienyl acrylate are preferred.

Unsaturated monomers $a_3$) having a hydrophobic radical are particularly preferably used, for example 2-ethylhexyl acrylate, lauryl acrylate and butyl acrylate.

The side radicals introduced, which are formed by partial grafting, are of the general formula I.
A preferred side radical B) is obtained therefrom with $R^1$=H, $R^2$=$CH_3$, X=O and Y=COO.

The copolymer consisting of $a_1$), $a_2$) and $a_3$) is prepared by emulsion polymerization by the known prior art (e.g. CA-A 614 181, U.S. Pat. No. 3,895,082).

In the emulsion polymerization, the monomers are dispersed in water with the aid of suitable emulsifiers. Usually, anionic and/or nonionic emulsifiers are used for stabilizing the latices. Examples of suitable emulsifiers are alkali metal or ammonium laurylsulfate, $C_{10}$–$C_{18}$-alkylsulfates, $C_{10}$–$C_{18}$-alkylsulfonates, alkylarylsulfonates, sulfates of alkylphenol ethoxylates, alkylphenol ethoxylates, alkyl alcohol ethoxylates or anionic organic phosphates or mixtures thereof. The emulsifiers are generally used in an amount of from 0.25 to 4% by weight, based on the sum of the reactants.

As a rule, water-soluble polymerization initiators are added to the reaction mixture in an amount of from 0.05 to 5% by weight, based on the sum of the polymerizable monomers. Examples of suitable initiators are the conventional compounds which produce free radicals, such as alkali metal peroxodisulfates, hydroperoxides or peroxides, if necessary in combination with reducing agents, such as sodium bisulfite or sodium hydroxymethylsulfonate, or azo compounds, for example azobisisobutyronitrile (AIBN).

In order to obtain products having sufficient solubility, a molecular weight regulator in an amount of from 0.1 to 5% by weight is preferably added during the emulsion polymerization. Examples of suitable regulators are mercaptans. tert-Dodecyl mercaptan is preferred.

The emulsion polymerization can be carried out by a batch, semicontinuous (continuous monomer addition) or continuous process (see Fitzer, Fritz: Technische Chemie, Springer Verlag, 1982) and in one or more stages (cf. EP-A-356 953). By the controlled addition of the individual monomers $a_1$) to $a_3$), it is possible in particular to control the incorporation of the acid groups into the polymeric binder. Thus, the properties of the printing plates (washout times, resistance to swelling) can also be changed in a controlled manner.

The emulsion polymerization is carried out in general at from 20° to 100° C., preferably from 40° to 70° C.

Any incompletely converted monomers, as usually occur in emulsion polymerization, can be removed by steam distillation methods, if necessary under reduced pressure (cf. Houben-Weyl, Methoden der organischen Chemie, 4th Edition, Volume 14/1, pages 468 and 469).

Core/shell microgels of the type described in EP-A 356 954 can also be used for producing the novel modified emulsion polymers.

To produce the novel recording material, the copolymer present in the acid form after the emulsion polymerization is partially grafted and if necessary then converted partially or completely into the salt-like form by neutralization.

Before the copolymer is further reacted, the water from the emulsion is removed. The emulsion is preferably freeze-dried. The polymer is then again dissolved in suitable solvents, such as toluene, tetrahydrofuran or acetone. Alternatively, the water can be separated off by distillation after the addition of a nonpolar solvent, for example toluene. The toluene/water mixture is distilled off and the toluene fraction recycled to the polymer solution or polymer emulsion.

Another very elegant method of dewatering comprises feeding the emulsion directly into an extruder, dewatering it there (for example by devolatilization under reduced pressure) and further reacting the copolymer in the melt (see below) and mixing the product with the components of the formulation. In the reaction in the extruder, the order in which the components are added (grafting reagent, neutralization reagent) is essentially unimportant. This method could be important in particular for large scale semicontinuous industrial production.

In all methods, the assistants (regulators, emulsifiers) used in the polymerization need not be removed. The printing plate formulation then also contains the components.

The polymers may be purified using the known methods of coagulation, filtration, washing and subsequent drying.

After removing the water, the polymer-analogous reactions of grafting and of neutralization are carried out. In further processing in solution, grafting is preferably first carried out since the viscosity of the solution is greatly increased by neutralization and further reaction is made more difficult.

A partial grafting is achieved by partial or complete reaction of the carboxyl groups in the emulsion polymers with compounds of the general formula II. $R^1$, $R^2$, X and Y have the same meanings as in formula I.

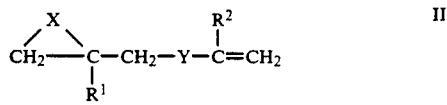

The reaction of carboxyl-containing low molecular weight compounds with compounds of the general formula (II) with ring cleavage is known per se and is described, for example, in the company publication Reactive Monomers, Nissan Blemmer G, High Polymer modifiers (Nippon Oil and Fats, Co. Ltd, 1968). Furthermore, the polymer-analogous reaction of carboxyl-containing polymers prepared by high pressure polymerization is known and is described in EP-A 231 002. Here and below, polymer-analogous reaction is understood as meaning that in each case a carboxyl group reacts with a formula unit (II) so that polymers having reactive double bonds distributed (attached) uniformly along the polymer chain are formed. The quantitative reaction of the carboxyl groups can be monitored by determining the acid number.

The reaction of the novel emulsion polymers with compounds of the general formula (II) takes place in a different manner. This is illustrated by the example of glycidyl methacrylate (GMA).

Although ring cleavage of the glycidyl methacrylate takes place quantitatively (the IR bands at 915 and 850 $cm^{-1}$ vanish completely), a decrease in the acid number, corresponding to the amount of GMA used, is not observed.

This can be explained by the fact that, after reacting with an acid function, a molecule of glycidyl methacrylate cleaves and undergoes an addition reaction with further units of glycidyl methacrylate, i.e. the novel graft copolymers are formed.

The average number n of monomer units undergoing addition (grafted) per reacted acid function can be calculated by comparing the experimentally determined acid number (mg of KOH/g of polymer) with the acid number theoretically expected for an equivalent reaction. In general, values of from 2 to 100, preferably from 2 to 20, are obtained for n.

In a preferred procedure, the emulsion copolymers A) are reacted with the compounds of the formula II in solvents such as tetrahydrofuran, toluene, ethylbenzene, methyl ethyl ketone, methyl isobutyl ketone or mixtures thereof. If necessary, p-dimethylaminopyridine, N-methylimidazole, tetraalkylammonium salts and/or other bases are added as catalysts (which reduce the initiation temperature) to the solutions of the emulsion copolymers A and, for example, 2,6-di-tert-butyl-p-cresol or N-nitrosodiphenylamine is added as an inhibitor. The desired amount of oxiran-2-yl or glycidyl, thiiran-2-yl or aziridin-2-yl compound is added dropwise to these solutions at a rate such that the temperature of the reaction mixture is from 40° to 110° C., preferably higher than 80° C. If required, the temperature is adjusted by heating or cooling. After the dropwise addition, the reaction mixture is advantageously stirred for a further 3-10 hours at 50° C. and the solvent is removed in a suitable manner, for example by distillation under reduced pressure.

In a further advantageous procedure, the copolymer A) is reacted with the abovementioned compounds in a kneader, for example at from 125° to 180° C. in the course of from 3 to 60 minutes, or the reaction is carried out in a twin-screw extruder, advantageously with a residence time of from 5 to 10 minutes (see above).

That component of composition II which is to be grafted is used in an amount of from 3 to 30, preferably from 4 to 10, particularly preferably from 4 to 8, % by weight, based on the emulsion polymer. Higher and lower amounts are possible, but higher amounts frequently give excessively hard layers and smaller amounts often result in too small a solubility difference between exposed and unexposed parts of the recording material to too low a crosslinking density in the exposed parts of the recording material.

The grafting reaction has substantial advantages compared with the polymer-analogous reaction. On the one hand, the number of reactive double bonds introduced can be increased without having to increase the amount of acid groups in the starting polymer. The crosslinking rate of the photosensitive mixture can thus be increased without having simultaneously to accept a sharp increase in the hardness of the exposed layer. On the other hand, sufficient unconverted acid functions remain after grafting is complete and some or all of said functions can be reacted with corresponding bases to give salt-like structures in the subsequent neutralization step (see below) to achieve the water solubility of the layers.

Surprisingly, the water solubility of the unexposed layers is also considerably improved by the grafting reaction without the resistance of the exposed layers to swelling decreasing. An excellent difference in solubility is thus achieved.

If required, further side radicals C) of the general formula IV

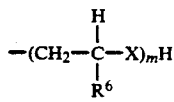

IV where X is oxygen, sulfur or imino, $R^6$ is a polar group, hydrogen or alkyl and $1 \leq m \leq 100$, can be introduced into the novel polymers.

If it is desired to introduce further radicals C) in addition to the olefinically unsaturated radicals B), only some of the carboxyl groups are reacted to introduce the radicals B), so that one or more carboxyl groups are available per molecular chain for the introduction of the radical C). In order to ensure that free carboxyl groups are still available in the end products for any salt formation, it is advantageous to allow only some of the carboxyl groups to react during the introduction of the radicals B) and, if required, C).

For example, oxirane, aziridine, thiirane, 2-methyloloxirane, 2-methylolaziridine, 2-methylolthiirane or 2-[ω-methylpoly(ethylene oxide)]-oxirane and compounds which contain glycidyl, oxiranyl, aziridinyl or thiiranyl radicals and strongly polar groups are suitable for the reaction for the optional introduction of radicals C).

The radicals C) are introduced under the same reaction conditions as those for the radicals B), and, depending on the nature of the radical C) to be introduced and on the reaction conditions, a polymer-analogous reaction (m=1) or a grafting reaction (m>1) takes place.

In the subsequent neutralization, the graft copolymers are partially neutralized with a base, for example an alkali metal hydroxide, an alkali metal alcoholate or acetate, ammonia or an amine or another base (cf. the salt formers stated below). For this purpose, the neutralizing agent is added to the polymer solution at elevated temperatures. The alkali metal hydroxides are metered in the form of aqueous or alcoholic solutions. The viscosity of the polymer solution increases sharply as a result of the neutralization.

A reaction time of, for example, 3 h at 80° C. is sufficient for quantitative reaction of the bases. The amount of neutralizing agent is from 3 to 10% by weight, based on the graft copolymer. The layers are water-insoluble in the case of smaller amounts and the water sensitivity of both the unexposed and the exposed layer is insufficient in the case of higher amounts.

The novel partially neutralized polymers $b_1$) are advantageously used for the production of printing plates, relief plates, photoresists and materials which are crosslinkable by photopolymerization. For this purpose, effective amounts of suitable photoinitiators $b_3$) and, if required, suitable photopolymerizable monomers $b_2$), salt formers, plasticizers, thermal polymerization inhibitors, dyes and pigments, agents for improving the relief structure, crosslinking agents, antioxidants, fillers, fluxes or mould release agents are added to them. Mixtures of the novel polyemers and these suitable additives are referred to below as mixtures for short.

Suitable photoinitiators $b_3$) are, for example, benzoin or benzoin derivatives, such as its methyl, isopropyl, n-butyl or isobutyl ether, symmetrically or asymmetrically substituted benzil acetals, such as benzil dimethyl acetal, or benzil 1-methyl-1-ethyl acetal; or acyldiarylphosphine oxides according to DE-A 29 09 992; or substituted and unsubstituted quinones, such as ethylanthraquinone, benzanthraquinone, benzophenone or 4,4'-bis-(dimethylamino)-benzophenone. They may be used alone or as a mixture with one another or in conjunction with coinitiators, for example ethylanthraquinone with 4,4'-bis-(dimethylamino)-benzophenone, benzoin methyl ether with triphenylphosphine, diacylphosphine oxides with tertiary amines or acyldiarylphosphine oxides with benzil dimethyl acetal. In the mixtures, they are used in an amount of from 0.001 to 10, advantageously from 0.1 to 5, in particular from 0.3 to 2, % by weight, based on a mixture, the amount also being determined by the presence of photopolymerized monomers.

Suitable photopolymerizable monomers $b_2$) are disclosed in, for example, U.S. Pat. No. 2,760,863 or U.S. Pat. No. 3,060,023. They have a boiling point higher than 100° C. at atmospheric pressure and a molecular weight of up to 3,000, in particular up to 2,000. Esters of acrylic acid and/or methacrylic acid with monohydric or polyhydric alcohols, e.g. butyl acrylate, butyl methacrylate, 2-ethylhexyl acrylate, lauryl (meth)acrylate, ethylene glycol di(meth)acrylate, butane-1,4-diol di(meth)acrylate, neopentylglycol di(meth)acrylate, 3-methylpentanediol di(meth)acrylate, 2-hydroxypropyl (meth)acrylate, 2-hydroxyethyl (meth)acrylate, hexane-1,6-diol di(meth)acrylate, 1,1,1-trimethylolpropane tri(meth)acrylate, di-, tri- and tetraethylene glycol di(meth)acrylate, tripropylene glycol di(meth)acrylate or pentaerythritol tetra(meth)acrylate, as well as poly(ethylene oxide) di(meth)acrylate, ω-methylpoly(ethylene oxide)-α-yl (meth)acrylate, N,N-diethylaminoethyl acrylate or a reaction product of 1 mol of glycerol, 1 mol of epichlorohydrin and 3 mol of acrylic acid, the vinyl esters of aliphatic monocarboxylic acids, e.g. vinyl oleate, the vinyl ethers of alcohols, e.g. octadecyl vinyl ether and butane-1,4-diol divinyl ether, the diesters of fumaric and maleic acid or the reaction products of OH-terminated, oligomeric polybutadienes with maleic acid or (meth)acrylic acid, i.e. oligomeric polybutadienes having activated, photopolymerizable olefinic double bonds, are suitable. In the mixtures, they are used, individually or as a mixture, in an amount of from 1 to 40, advantageously from 2 to 30, in particular from 5 to 20, % by weight, based on a mixture.

Suitable salt formers are 1. inorganic metal compounds, such as oxides, hydroxides, alkoxides where the alkyl radical of is 1 to 4 carbon atoms or carbonates of the cations of Na, K, Li, Mg, Ca, Sr, Ba, Al, Ga, In, Ge, Sn, Pb, Sb, Bi, Zn, Cd, Sc, Y, La, Ti, Zr, Hf, V, Nb, Ta, Cr, Mo, W, Mn, Re, Fe, Co, Ni, Pd or the lanthanides or
2. organometallic compounds of the structure (V)

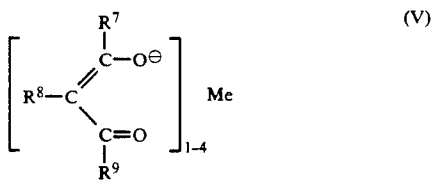

where Me is a cation of one of the abovementioned elements, $R^7$, $R^8$ and $R^9$ are identical or different alkyl, cycloalkyl, aryl or alkylaryl groups and $R^7$ and $R^9$ may be cyclically bonded to one another via ring systems and furthermore $R^8$ may be hydrogen, or
3. ammonia or
4. polyfunctional amines, such as ethylenediamine, diethylenetriamine, N-methyl-N-ethylethylenediamine, N,N-dimethylethylenediamine, N,N'-diethylethylenediamine, N,N,N',N'-tetramethylethylenediamine, N,N,N'',N''-tetramethylethylenetriamine, 1,3-diaminopropane, 1,4-diaminobutane, pyrazine or polyvinylpyridine or
5. hydrazine or
6. cyclic amines, e.g. morpholine, or
7. hydroxyl-containing amines, e.g. ethanolamines, or
8. ethoxylated and/or propoxylated amines.

The oxides, hydroxides, alkoxides, carbonates and acetylacetonates of $Na^\oplus$, $Li^\oplus$, $Mg^{2\oplus}$, $Ca^{2\oplus}$, $Sr^{2\oplus}$, $Ba^{2\oplus}$, $Al^{3\oplus}$ $Sn^{3\oplus}$, $Sb^{3\oplus}$ and $Zn^{2\oplus}$, bis-(acetylacetonato)-Zn(II), MgO and LiOH being particularly preferred.

They are advantageously used in an amount of from 0.05 to 20, preferably from 0.5 to 15, in particular from 1 to 10, % by weight, based on a novel polymer.

Examples of suitable plasticizers are modified and unmodified natural oils and natural resins, such as paraffinic or naphthenic oils, and mineral oil resins or pentaerythritol esters of hydrogenated rosin; esters of alkyl, alkenyl, arylalkyl or arylalkenyl alcohols with acids such as citric acid, acetic acid, propionic acid, butyric acid, ethylbutyric acid, ethylhexanoic acid, glycolic acid, benzoic acid, phthalic acid, trimellitic acid, abietic acid, phosphoric acid or stearic acid; synthetic oligomers or resins, such as oligostyrene, oligomeric styrene/butadiene copolymers, oligo-α-methylstyrene, oligomeric α-methylstyrene/vinyltoluene copolymers, liquid 1,2- or 1,4-oligobutadienes, oligopentadienes, liquid oligomeric acrylonitrile/butadiene copolymers and polyterpene, polyacrylate, polyester or polyurethane resins, synthetic polymers, such as polyethylene or ethylene/propylene/diene rubbers; ω-methyl-oligo(ethylene oxide), or sulfonamide. A particularly suitable sulfonamide is N-n-butylbenzenesulfonamide (Cetamoll ® BMB from HASF AG). Amounts of from 1 to 20% by weight, based on a mixture, are advantageous, but up to 30% by weight are possible.

Suitable thermal polymerization inhibitors, which are generally added in an amount of from 0.001 to 2% by weight, based on a mixture, and have no significant self-absorption in the actinic range in which the photoinitiator absorbs, are, for example, hydroquinone, p-methoxyphenol, 2,6-di-tert-butyl-p-cresol, β-naphthol, phenothiazine, pyridine, nitrobenzene, m-dinitrobenzene or chloranil; thiazine dyes, such as Thionine Blue G (C.I. 52,025), Methylene Blue B (C.I. 52,015) or Toluidine Blue (C.I. 52,040); or N-nitrosamines, such as N-nitrosodiphenylamine, or the salts, for example the potassium, calcium or aluminum salts of N-nitrosocyclohexylhydroxylamine.

Suitable dyes, pigments or photochromic additives b5) are added to the mixtures in an amount of from 0.0001 to 2% by weight, based on a mixture. They are used for controlling the exposure properties, for identification, for direct checking of the result of exposure or for aesthetic purposes. A precondition for the choice and the amount of such additives is that they adversely affect the photopolyerization of mixtures to as little an extent as the thermal polymerization inhibitors. For example, the soluble phenazinium, phenoxazinium, acridinium and phenothiazinium dyes, such as Neutral Red (C.I. 50,040), Safranine T (C.I. 50,240), Rhodanil Blue, the salt or amide of Rhodamine D (Basic Violet 10, C.I. 45,170), Methylene Blue B (C.I. 52,015), Thionine Blue G (C.I. 52,025) or Acridine Orange (C.I. 46,005), and also Solvent Black 3 (C.I. 26,150). These dyes are also used together with a sufficient amount of a reducing agent which cannot reduce the dye in the absence of actinic light but is capable of reducing the dye in the excited electronic state. Examples of such mild reducing agents are ascorbic acid, anethole, thiourea, e.g. diethylallylthiourea, in particular N-allylthiourea, and hydroxylamine derivatives, in particular salts of N-nitrosocyclohexylhydroxylamine, preferably the potassium, calcium and aluminum salts. As mentioned, the latter can also serve as thermal polymerization initiators. The reducing agents are generally added in amounts of from 0.005 to 5% by weight, based on a mixture, the addition of from 3 to 10 times, based on the amount of dye present, having proven useful in many cases.

Suitable agents for improving the relief structure of the printing plates produced from the mixtures are, for example, 9,9'-dianthronyl and 10,10'-bis-anthrone, according to DE-A 27 20 560.

The mixtures may furthermore contain crosslinking agents, such as the trifunctional and tetrafunctional mercapto compounds described in U.S. Pat. No. 4,179,531 and U.S. Pat. No. 4,234,676.

To protect the mixtures from decomposition by oxidation and thermal oxidation by atmospheric oxygen, effective amounts of suitable antioxidants may be added to them, for example sterically hindered monophenols, such as 2,6-di-tert-butyl-p-cresol, alkylated thiobisphenols and alkylidenebisphenols, such as 2,2'-methylene-bis-(4-methyl-6-tert-butylphenol) or 2,2'-bis-(1-hydroxy-4-methyl-6-tert-butylphenyl) sulfide, hydroxybenzyl compounds, such as 1,3,5-trimethyl-2,4,6-tris-(3,5-di-tert-butyl-4-hydroxybenzyl)-benzene, triazines, such as 2-(4-hydroxy-3,5-tert-butylaniline)-4,6-bis-(n-octylthio)-1,3,5-triazine, polymerized trimethyldihydroquinone, zinc dibutyldithiocarbamate, dilauryl thiodipropionate or phosphites, such as tris-(nonylphenyl) phosphite. Amounts of from 0.001 to 5% by weight, based on a mixture, are advantageous.

Suitable nonmiscible polymeric or nonpolymeric organic and inorganic fillers or reinforcing fillers are those which are essentially transparent at the wavelengths of the light used for exposing novel mixtures and do not scatter this light and whose refractive index is substantially matched with that of the relevant mixture, for example polystyrene, organophilic silica, bentonite, silica, organophilic alumina, glass powder, colloidal carbon and various types of dyes and pigments. These additives are used in amounts which vary with the desired properties of the novel materials. The fillers have the advantage that they improve the strength of the novel mixtures, help to reduce the tack and may act as colorants.

The mixtures may furthermore contain suitable fluxes, such as calcium stearate and/or mold release agents, such as talc, in effective amounts.

When the mixtures are used as photopolymerizable adhesives and sealing compounds, it is advisable to add tackifiers, for example paraffin resins, rosin esters, polyterpenes, coumarone/indene resins or compounds according to U.S. Pat. No. 4,133,731.

The amount of additives, which may or may not be used, should in general not exceed 50, in particular 40, by weight of a mixture.

The preparation of the mixtures from the components has no special features with regard to the method; the conventional kneading, mixing and solution methods may be used.

The mixtures thus obtained can be used directly as photocrosslinkable adhesives and sealing compounds or can be further processed into photocrosslinkable films and into plates, in particular printing plates, relief plates and photoresists. For this purpose, they are shaped into sheet-like structures of the desired thickness in a conventional manner by casting from a solution, hot pressing, calendering or extrusion. In the case of the printing plates, the thickness depends primarily on the intended use of the sheet-like structure and varies in general from 0.001 to 7 mm, in particular from 0.025 to 6.5 mm, since, for example, printing plates produced therefrom and having this thickness are suitable for the majority of printing methods. Films may be of any thickness.

The sheet-like structures can be processed as such to give printing plates, relief plates and photocrosslinkable photoresists; however, it is usual to prepare them as a laminate with other layer-like materials before further processing. Such a laminate is referred to in general as a multilayer element, and the sheet-like structure present therein is referred to as a relief-forming layer (RL).

Usually, such a multilayer element contains a relief-forming layer (RL) which is adhesively bonded to a dimensionally stable substrate (S). The dimensionally stable substrate (S) in turn may be backed with a flexible and resilient lower layer (L) according to DE-A 24 44 118. Furthermore, a top layer (TL) and/or a cover sheet (CS) may be applied to that side of the layer (RL) facing away from the substrate (S). If the top layer (TL) and cover sheet (CS) are used together, (TL) is present directly on the layer (RL), and an antiadhesion layer (AL) may furthermore be present between (TL) and (CS). In addition, a firm adhesive bond can be achieved between (S) and (RL) and, where relevant, (RL) and (CS) with the aid of an adhesion-promoting layer (AP).

Sheets, films or conical sleeves of metals, such as steel, aluminum, copper or nickel, or of plastics, such as polyethylene terephthalate, polybutylene terephthalate, polyamide or polycarbonate, may be used as dimensionally stable substrates (S). Woven fabrics and nonwovens, for example glass fiber fabrics or composite materials of, for example, glass fibers and plastics, such as polyethylene terephthalate, are also suitable.

About 0.5–40 μm thick layers of a mixture of adhesive-forming components according to DE-A 31 00 175 or DE-A 31 07 741 are advantageously used as adhesion-promoting layers (AP).

Suitable top layers (TL) (also referred to as substrate or release layer) are in general from 0.5 to 20 μm thick and may consist of a polymer which forms soluble, nontacky, transparent and strong films. In general, the top layer is impermeable to oxygen so that it prevents inhibition of photopolymerization by atmospheric oxygen in the photopolymerizable relief-forming recording layer (RL). It is nontacky, so that an image-bearing mask or photographic negative placed on top of it can readily be removed again from the novel recording element. Advantageously, it adheres to the surface of the photopolymerizable or imagewise exposed relief-forming recording layer (RL) more firmly than to any cover sheet (CS) present on it.

The optically transparent top layer (TL) may be smooth, i.e. it may have a surface roughness $R_{max}$ of $\leq 0.1$ μm. It is advantageously dull, i.e. its surface roughness $R_{max}$ is from 0.1 to 15 μm, preferably from 0.3 to 10 μm, in particular from 0.5 to 7 μm. As a result of the dull effect, the time in which the image-bearing mask or photographic negative can be brought into contact with the novel recording element is considerably reduced.

If the thickness of the optically transparent top layer (TL) is smaller than its surface roughness $R_{max}$, the surface of the photopolymerizable relief-forming recording layer (RL) present underneath the optically transparent top layer (TL) is likewise dull, which is often advantageous.

The optically transparent top layer (TL) mainly contains a polymer capable of forming strong films or consists of such a polymer. The choice of the polymer for the production of the optically transparent top layer (TL) depends primarily on the solubility properties of the polymer on the one hand and on the photopolymerizable relief-forming recording layer (RL) to be covered herewith or on its uppermost individual layer on the other hand. The solubilities can be matched with one another so that said recording layer (RL) or its uppermost individual layer or the polymeric binder present therein on the one hand or the optically transparent top layer on the other hand are not soluble or swellable in one and the same solvent.

Examples of suitable polymers for optically transparent top layers (TL) which are soluble or swellable in organic solvents are polyamides, copolyamides, polyethylene, polystyrene, styrene/acrylonitrile copolymers, polyvinyl chloride, vinyl chloride/vinyl acetate copolymers, polycarbonates, silicone rubbers, polyesters, polyurethanes, poly(meth)acrylates, cyclized rubbers having a high degree of cyclization, ethylene/propylene copolymers and ethylene/vinyl acetate copolymers.

Examples of suitable polymers for optically transparent top layers which are soluble or swellable in water or in aqueous solvents are partially or almost completely hydrolyzed poly-(vinyl alkanecarboxylates), partially or almost completely hydrolyzed vinyl alkanecarboxylate/polyalkylene oxide graft copolymers, gelatine, cellulose esters, cellulose ethers, polyvinylpyrrolidone, vinylaromatic/alkanedicarboxylic anhydride copolymers, vinyl ether/alkanedicarboxylic anhydride copolymers, poly(meth)acrylic acid, (meth)acrylic acid/-(meth)acrylate copolymers and polyalkylene oxides.

The optically transparent top layer (TL) which is soluble or swellable in water or in aqueous solvents may furthermore consist of suitable low molecular weight compounds which are soluble in water or aqueous solvents. Examples of suitable compounds are saponines and saccharides.

Examples of particularly suitable polymers to be used according to the invention for the optically transparent top layer (TL) which is soluble or swellable in water or in aqueous solvents are the partially or almost completely hydrolyzed poly- (vinyl alkanecarboxylates) and the partially or almost completely hydrolyzed vinyl alkanecarboxylate/polyalkylene oxide graft copolymers, of which partially or almost completely hydrolyzed polyvinyl acetate or propionate having a degree of hydrolysis of from 60 to 99%, preferably from 70 to 98%, in particular from 75 to 95%, and a number average molecular weight $\overline{M}_n$ of from $10^4$ to $10^5$, in particular from $1.5 \times 10^4$ to $5 \times 10^4$, and the partially or almost completely hydrolyzed ethylene oxide/vinyl acetate and ethylene oxide/vinyl proprionate graft copolymers which are obtained by grafting vinyl acetate or propionate onto polyethylene oxide and then carrying out hydrolysis and contain from 10 to 30% by weight of polymerized ethylene oxide are very particularly suitable.

The partially hydrolyzed vinyl acetate/ethylene oxide copolymers which are available under the name Mowiol® 04-M1 from Hoechst (cf. Mowiol Polyvinylalkohol, Hoechst company publication, 1984) are very useful.

Suitable cover sheets (CS) are in general from 20 to 150 μm thick and consist of, for example, a polymer such as polyamide or polyethylene terephthalate.

Suitable antiadhesion layers (AL) are in general from 0.1 to 0.5 μm thick and consist of, for example, silicone resins according to EP-A 68 599.

If highly reflective sheets or films are used as substrates (S), they may contain suitable antihalation agents, such as carbon black or manganese dioxide. The antihalation agents can, however, be applied to (S) as a separate layer or may be present in the adhesion-promoting layer (AP) or in the relief-forming layer (RL).

The production of such multilayer elements has no particular features with regard to the method and may be effected by applying the relief-forming layer (RL) to the substrate (S) by casting from solution, hot pressing, calendering or extrusion. The other layers can then be applied to this two-layer element in a known manner. However, it is also possible first to apply the layer (RL) to that side of a cover sheet (CS) which is covered with a top layer (TL) and then to bond the uncovered side of the layer (RL) to the substrate (S).

Photocrosslinked printing plates, relief plates, photoresists and films can be produced from the sheet-like structures which consist of the mixtures or from the multilayer elements which contain relief-forming layers (RL) of such mixtures. The conversion of printing plates, relief plates, photoresists or films which are crosslinkable by photopolymerization into printing plates, relief plates, photoresists or films crosslinked by photopolymerization also has no special features with regard to the method.

It is carried out, if necessary after a pretreatment, by imagewise exposure of the printing plates, relief plates or photoresists to actinic light having a wavelength of from 230 to 450 nm, advantageously from 300 to 450 nm, through photographic negatives placed on top, washing out the unexposed and therefore uncrosslinked parts of the printing plates, relief plates or photoresists with the aid of suitable developers, drying the resulting plates which consist of or contain a relief layer (RL') and, if necessary, aftertreating the plates. In the case of the films, uniform exposure is carried out. Of course, in the case of crosslinked films produced by uniform exposure to actinic light, the further process steps are dispensed with.

Examples of suitable sources of actinic light are commercial UV fluorescent tubes, medium pressure, high pressure and low pressure mercury lamps, superactinic fluorescent tubes, pulsed xenon lamps, lamps doped with metal iodides or carbon arc lamps.

Suitable developers are water or aqueous solvents (aqueous bases, aqueous alcoholic solvents). Aqueous bases are preferably used, particularly preferably water.

Examples of aqueous bases suitable for development are aqueous solutions of lithium, sodium or potassium hydroxide or of lithium, sodium or potassium carbonate or bicarbonate or of ammonia. Examples of suitable aqueous alcoholic developers are aqueous solutions which contain minor amounts of methanol, ethanol, isopropanol or n-butanol. The developers may furthermore contain solid, liquid or gaseous organic and inorganic compounds, such as surfactants, complexing agents or salts, in minor amounts.

Examples of suitable aftertreatment methods are aftertreatment with bromine-containing solutions, uniform postexposure to actinic light having a wavelength $\lambda$ of from 250 to 450 ran and postexposure to light having a wavelength $\lambda$ of less than 250 nm.

Where the relief-forming layer (RL) and top layer (TL) have different solubility properties, the photosensitive recording element can be developed in one operation using a water-in-oil emulsion or oil-in-water emulsion according to German Application No. P 39 08 763.8.

The thickness of the relief layer (RL') of the plates varies from 0.001 to 7 mm, depending on the intended use, thicknesses of from 0.025 to 6.5 mm being advantageous.

The printing plates obtained in this manner can be mounted on printing cylinders, if necessary roughened by corona discharges and used for printing continuous stationery.

The mixtures have many advantages in their preparation and processing. For example, they can be very readily processed by the conventional methods, in particular their ready meterability in the form of grains facilitating the feeding of extruders, with the result that the presence of external lubricants is unnecessary. The processed materials and plates are clear and transparent, making it possible in particular to produce photocrosslinked printing plates, relief plates and photoresists having relief layers (RL') with a very great relief height and good sidewall structure. This is essential, for example, for printing a rough, wavy surface, for example of corrugated board, box board or serviettes. Relief heights of more than 3 mm can therefore be produced without problems, as with conventionally embossed rubber plates, without the depths of the layers becoming clogged through polymerization. Not least, the clarity of the mixtures permits short exposure times without resulting in unacceptable polymerization gradients in the relief layers (RL'). The exposed materials and plates are stable to external chemical and physical influences and are nontacky. In particular, the printing plates have high resistance to printing ink solvents and good abrasion resistance, permitting very long print runs. The main advantage of the photopolymerized materials and plates based on the novel polymers is their resistance to cracking.

After exposure, the multilayer elements can be developed in pure water at room temperature to give the plate. The exposure and washout times are a few minutes.

As a result of the grafting reaction, the water solubility of the unexposed parts is greatly improved without the resistance to swelling having decreased. An excellent difference in solubilities is thus obtained.

The solvent absorption of the exposed layers in water, ethanol and ethyl acetate is very low, which is very important for printing long runs (production runs). The exposed and washed out plates have low Shore A values characterizing hardness and very high elongation at break and are therefore particularly suitable as flexographic printing plates.

In addition to the abovementioned intended uses, the novel polymers can also be employed for the production of hotmelt adhesives, adhesion promoters, antidrumming compounds, damping materials for mechanical impacts or surface coatings. They are also suitable as additives for thermoplastics, synthetic rubbers or bitumen.

EXAMPLES

Examples 1 to 6 relate to photopolymerizable recording materials. Examples 1 to 4 are according to the invention. Examples 5 and 6 are Comparative Examples.

Examples 1 to 6 are preceded by Experiments 1 and 2. Experiment 1 describes the preparation of an emulsion polymer used for the novel recording materials. Experiment 2 demonstrates a polymer-analogous reaction of known ethylene/acrylic acid copolymers with a substance which reacts as a graft monomer in the novel polymers.

In the Examples and Experiments below, acid number is the amount of 100% strength KOH in mg which is required to neutralize 1 g of product. The Shore A hardness was determined according to DIN 53,505, and the swelling of the samples, in % by weight, was determined after storage for 24 hours in $H_2O$ or ethanol.

EXPERIMENT 1

Preparation of an emulsion polymer

A mixture of 1,081 parts by weight of fully demineralized water, 1.5 parts by weight of sodium ethylenediaminetetraacetate, 4.6 parts by weight of sodium formaldehyde sulfoxylate, 23.2 parts by weight of a 40% strength solution of a sodium alkylsulfonate having a chain length of 12 to 16 carbon atoms, 6% of feed 1 described below and 9% of feed 2 described below was initially taken, under nitrogen, in a steel autoclave having a stirrer, temperature controller and feed apparatuses. The mixture was then heated to 60° C. and prepolymerized for 10 minutes, and the remainder of a mixture of 3089.6 parts by weight of fully demineralized water, 57.7 parts by weight of a 40% strength solution of sodium alkylsulfonate, 1158.2 parts by weight of methacrylic acid, 694.9 parts by weight of methyl methacrylate, 463.3 parts by weight of n-butyl acrylate, 2316.5 parts by weight of butadiene and 92.6 parts by weight of tert-dodecyl mercaptan (feed 1) and the remainder of a solution of 13.9 parts by weight of sodium peroxodisulfate in 926.6 parts by weight of fully demineralized water (feed 2) were metered into the autoclave simultaneously in the course of 3.5 hours. The content of the autoclave was left at 60° C. for a further 7 hours while stirring; thereafter, the pressure was let down and 77.2 parts by weight of a 25% strength solution of ammonia in water were added. The resulting dispersion had a solids content of 46.3%.

The dispersion was then freeze-dried.

A flexible transparent polymer having an acid number of 163 mg of KOH/G of polymer resulted.

EXPERIMENT 2

An ethylene/acrylic acid copolymer was reacted with glycidyl methacrylate according to Example 1 of EP-A 231 002. The resulting polymer had the acid number theoretically expected for the reaction of one acid function with one glycidyl methacrylate molecule. Thus, a polymer-analogous reaction occurred.

EXAMPLE 1

Preparation of the graft copolymer 148.5 parts by weight of the emulsion Polymer prepared in Experiment 1, 0.74 part by weight of p-dimethylaminopyridine and 0.7 part by weight of 2,6-di-tertbutyl-p-cresol were dissolved in 222.8 parts by weight of toluene. The solution was heated to 80° C., and 12.2 parts by weight of glycidyl methacrylate were added dropwise. Refluxing was then carried out for 3 hours. The content of free glycidyl methacrylate in the solution was less than 0.1% by weight. The resulting graft copolymer was precipitated in cold water and had an acid number of 145 mg of KOH/G of polymer. From this, it is found that the average number n of monomer molecules undergoing addition per reacted acid function is 5.3. Preparation of the photopolymerizable recording material 8 parts by weight of KOH, as a concentrated aqueous solution, were added dropwise to the solution of the graft copolymer in toluene at 80° C.

Thereafter, the remaining components of the formulation were added in the following order: 16.1 parts by weight of oleic acid, 8 parts by weight of 2-ethylhexyl acrylate and 1.92 parts by weight of benzil dimethyl ketal. The solution was evaporated down in a rotary evaporator and poured onto a 125 μm thick polyethylene terephthalate film laminated with a 5 μm thick polyvinyl alcohol film (Mowiol ® 04-M1 from Hoechst), dried for 2 hours at 70° C. and laminated with a substrate film coated with a mixture of adhesive-forming components.

After removal of the polyethylene terephthalate film, the layer was exposed imagewise through a photographic negative and then developed in fully demineralized water at room temperature in a brush washer to give the plate.

EXAMPLE 2

Preparation of the graft copolymer

The procedure was the same as that of Example 1, except that 30 parts by weight of 2-methylglycidyl acrylate, instead of 12.2 parts by weight of glycidyl methacrylate, were added to the emulsion polymer. From the experimentally determined acid number it was found that $n=16$.

The photopolymerizable recording material was prepared as in Example 1.

EXAMPLE 3

The graft copolymer was prepared as in Example 1.
The photopolymerizable recording material was prepared as in Example 1, except that 10 parts of diethanolamine were used as the neutralizing agent.

EXAMPLE 4

Preparation of the photopolymerizable recording material in an extruder

The graft copolymer was prepared in a twin-screw extruder starting from the emulsion polymer of Experiment 1, and the photopolymerizable recording material was prepared from said graft copolymer. The following components were used (total throughput=30 kg/h):

| | | |
|---|---|---|
| Polymer of Experiment 1 | 8,000 | parts by weight/h |
| 2-Methylglycidyl methacrylate | 184 | parts by weight/h |
| KOH (flakes) | 110 | parts by weight/h |
| Hexanediol diacrylate | 221 | parts by weight/h |
| Benzil dimethyl ketal | 44 | parts by weight/h |
| Cetamoll ® BMB | 368 | parts by weight/h |
| 2,6-Di-tert-butyl-p-cresol | 30 | parts by weight/h |

The dispersion was first pumped into the extruder, and the water was removed in three successive devolatilization units. 2,6-Di-tert-butyl-p-cresol was added in the melting zone.

The grafting agent was then metered in and was quantitatively reacted in a residence time of a few minutes and at 140° C. Thereafter, the KOH was mixed in and Cetamoll and benzil dimethyl ketal, which was dissolved beforehand in hexanediol diacrylate, were metered in.

The molten material was extruded through a slot die and was shaped into 700 μm thick layers (without films) which were within the tolerance limits, between two coated substrate films (upper roll coated with a mixture of adhesive-forming components and lower roll coated with Mowiol ® 04/M1 from Hoechst). Analysis of the layers showed that 10 monomer molecules had undergone addition per reacted acid function.

EXAMPLE 5

Preparation of the photopolymerizable recording material

The procedure was similar to that of Example 1, except that the ungrafted emulsion polymer from Experiment 1 was used.

EXAMPLE 6

Preparation of the photopolymerizable recording material

The procedure was similar to that of Example 1, except that the polymer of Experiment 2, obtained by a polymer-analogous reaction of an ethylene/acrylic acid copolymer with glycidyl methacrylate, was used instead of the grafted emulsion polymer.

Comparison of the novel photopolymerizable recording materials (Examples 1 to 4) with those of the prior art (Examples 5 and 6) shows the advantages of the novel graft copolymers (see Table).

The advantages of the photopolymerized materials and shapes based on the novel polymers are evident in the processing to give the plate and in the physicochemical characterization of the layers (see Table):

TABLE

| Example | Exposure time (minutes) | Washout time (minutes) | Shore A | Swelling** in AB H$_2$O | Ethanol**) | (% by weight) |
|---|---|---|---|---|---|---|
| 1 | 6 | 6 (water, RT) | 55 | 12 | 18 | 200 |
| 2 | 4 | 3 (water, RT) | 65 | 10 | 14 | 180 |
| 3 | 7 | 7 (water, RT) | 50 | 8 | 19 | 240 |
| 4 | 6 | 7 (water, RT) | 60 | 8 | 16 | 180 |
| 5* | 16 | 12 (water, RT) | 45 | 220 | 40 | 400 |
| 6* | 6 | 14 (water, 60° C.) | 55 | 10 | 16 | 80 |

*Comparative Examples
**)Swelling and elongation at break were determined for correctly exposed and washed out plates; the elongation at break was determined according to ASTM D 638.

The combination of good resistance to swelling in printing ink solvents and high flexibility and resilience, which is decisive for obtaining good printed copies, is exhibited only by the novel formulations, which also have the advantage that they can be developed in pure water at room temperature.

We claim:
1. A modified polymer in acid form or in the form of its salts, consisting essentially of
A) a carboxyl-containing copolymer and
B) side radicals introduced therein by partial grafting onto the carboxyl groups and of the formula I

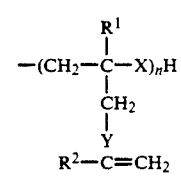

where $R^1$ and $R^2$ are each hydrogen or $C_1$–$C_5$-alkyl, X is oxygen or sulfur, Y is an ester, amide, ether or $C_1$–$C_{10}$-alkylene group and $1 < n \leq 100$ for the average number n of the monomer units undergoing addition per reacted acid function, wherein the copolymer A) was obtained by emulsion polymerization of a$_1$) from 40 to 80% by weight of one or more conjugated dienes, a$_2$) from 10 to 50% by weight of acrylic acid, methacrylic acid or a mixture of acrylic acid and methacrylic acid, and a$_3$) from 0 to 50% by weight of one or more ethylenically unsaturated monomers and the amount of radicals B) in the modified copolymer is from 3 to 30% by weight, based on the unmodified polymers.

2. A polymer as claimed in claim 1, wherein the conjugated diene a$_1$) is butadiene and the ethylenically α,β-unsaturated acid a$_2$) is methacrylic acid.

* * * * *